United States Patent [19]

Alles

[11] Patent Number: 4,593,191
[45] Date of Patent: Jun. 3, 1986

[54] PRESSURE AND OPTICAL SENSITIVE DEVICE WITH DEFORMABLE PROTRUSIONS

[75] Inventor: Harold G. Alles, Bridgewater, N.J.

[73] Assignee: AT&T Bell Laboratories, Murray Hill, N.J.

[21] Appl. No.: 454,264

[22] Filed: Dec. 29, 1982

[51] Int. Cl.⁴ ............................................. H01J 5/16
[52] U.S. Cl. ..................................... 250/227; 901/47
[58] Field of Search ............ 250/549, 227, 221, 231 P, 250/229; 340/712, 365 P; 350/360, 363; 901/47; 356/364

[56] References Cited

U.S. PATENT DOCUMENTS

| | | | |
|---|---|---|---|
| 3,966,326 | 6/1976 | Brull et al. | 356/114 |
| 4,017,848 | 4/1977 | Tannas | 340/365 R |
| 4,116,531 | 9/1978 | Greenwood | 350/96.20 |
| 4,346,376 | 8/1982 | Mallos | 340/712 |
| 4,360,247 | 11/1982 | Beasley | 350/96.15 |

Primary Examiner—David C. Nelms
Assistant Examiner—J. Gatto
Attorney, Agent, or Firm—Ronald D. Slusky

[57] ABSTRACT

There is disclosed a tactile sensor comprised of a compliant overlay having a surface of spatially dispersed semi-spherical domes in registration with sequentially pulsed signal means, such as light emitting diodes. The domes adaptively collapse upon the application of pressure applied to the opposite surface of the overlay entrapping signals by reflection between the overlay surfaces. The entrapped signals migrate by reflection to the edges of the overlay for reception by photodetectors. The output from the photodetectors is then processed for determining the magnitude, location and profile of the pressure applied across the overlay. A feedback arrangement is also provided for controlling the magnitude of the externally applied pressure.

11 Claims, 6 Drawing Figures

PRESSURE AND OPTICAL SENSITIVE DEVICE WITH DEFORMABLE PROTRUSIONS

TECHNICAL FIELD

This invention relates to an optically sensitive surface for determining the magnitude and pattern of pressure applied to a surface and more particularly to compliant tactile sensors for use in robotic applications and the like.

BACKGROUND OF THE INVENTION

Voice (sound) and pattern (image) recognition by a computer for interaction with an operator is now possible. It is highly desirable to extend a computer's senses to include the sense of touch for computer manipulation and recognition of objects. While some progress has been made in developing tactile sensors the sensors produced thus far are crude in comparison to the advances made in the art of computer recognition of sound and images.

Simple tactile sensors in which particular ones of an array of electrical membrane type switches operating in response to pressure have been devised. Such sensors are indicative of whether pressure has or has not been applied and provide no information which can be integrated into a feedback arrangement to control the magnitude of the applied pressure. While sensing of surface detail can be done using an array of membrane switches, much information respective to surface texture and shape of an object is lost due to the inherent threshold of mechanical switches. Surface and pattern information is generally acquired by adding visual adjuncts, such as television equipment monitored by an attendant, to complement the tactile arrangement. However, this is a costly alternative.

Other attempts have been made to solve the problem, such as the use of mechanical strain gauges placed in a tactile arrangement for measuring pressure. Arrangements of this type are somewhat successful in ascertaining pressure but suffer from the disadvantages of requiring calibration of the strain gauges and the inability to ascertain accurately the pattern of an object.

Conductive elastomers and the like whose conductivity changes as a function of applied pressure, have been used to fashion an array of tactile sensors in the form of robotic fingers. Sensors of this type operate properly and at first glance appear to be a solution to above-mentioned problems. However, these materials fatigue easily when flexed over a short duration, which, in turn, degrades the response of the material to the application and removal of pressure.

Advancements in the art of compliant touch sensitive surfaces include a bezel, such as plate glass, which is placed over the face of a cathode ray tube. Signals emitted by the cathode ray tube enter the glass plate bezel and become entrapped between the surfaces of the bezel by total internal reflection when touched. The trapped signals then travel to the sides of the plate glass bezel where photodetectors register the entrapment. Besides plate glass, flat compliant surfaces are used to enhance the injection of signals into the overlay. Signals emitted by a cathode ray tube become entrapped between the surfaces of the flat compliant overlay at a point in which the overlay is deformed.

Devices of this nature can be arranged as tactile sensors in which the entrapped light would be indicative of the pressure applied to the device. However, such devices cannot identify the pattern of the applied pressure due to inefficient modulation of light by the deformation of a flat compliant surface. Moreover, these devices show no initial response to pressure due to the operating characteristics of the flat compliant surface. As such, these devices are more suitable as compliant screens controled by a human operator rather than as tactile devices for robotic applications.

SUMMARY OF THE INVENTION

Advantage is taken of the aforementioned prior art arrangements wherein the screen overlay is a compliant flat surface. I have taken the flat overlay and molded in an array of semi-spherical domes or protrusions on one side of the overlay. Each dome or protrusion is positioned over the top of a sequentially operated Light Emitting Diode (LED) so that the tip of each dome just touches its respective LED over a small area. Since there is mostly air between the LED and the dome, the optical coupling between the LED and overlay is poor. Pressure applied to the compliant overlay causes a dome or domes within the vicinity of the pressure to collapse, thereby immediately increasing the optical coupling of light between the two surfaces. Light entering the overlay is trapped and propagates by internal reflection to the sides of the overlay where it is detected by photodiodes. The output from the photodiodes is processed by a microcomputer to measure pressure applied to the overlay.

My invention also recognizes the edge pattern or profile of an object held between the overlay and a source of pressure, such as the pressure exerted by robotic claws. The coordinates of each pulsed LED which results in a reception of light by photodiodes placed at the sides of the overlay is noted by a microprocessor. It is then a simple matter for the microprocessor to construct the pressure pattern from the coordinates or compare the coordinates against a stored template.

DETAILED DESCRIPTION

Figure 1:
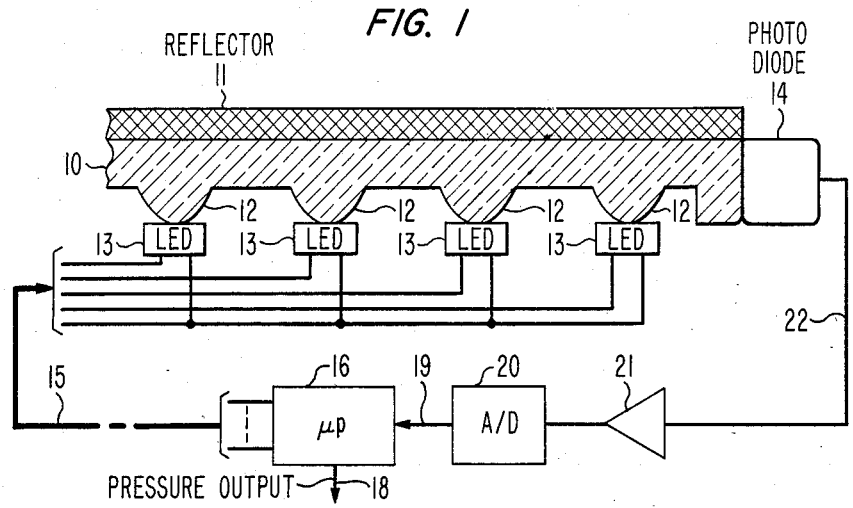
FIG. 1 is a cutaway view of my invention in registration with an operational system shown in block diagram form.

As shown in FIG. 1, compliant overlay 10, which can be, typically, a product called Sylgard manufactured by Dow Company, is arranged in a manner in which the tips of semi-spherical domes 12 protruding from overlay 10 are in registration with Light Emitting Diodes (LED) 13. Since a dome 12 normally touches its respective LED 13 over a small area the optical coupling between the two devices 12, 13 is poor. Only light emitted by LED 13 travelling nearly perpendicular to the point of contact enters overlay 10. The amount of light entering overlay 10 is small as compared to the light which enters the air gap and reflects off the sides of dome 12 at a shallow angle.

As will be discussed more fully, the small amount of light entering the overlay at a steep angle dissipates before reaching photodiodes 14 stationed at the sides of overlay 10. The small amount of light entering overlay 10 at a steep angle is reflected between the surfaces of reflector 11 and overlay 10 and is substantially absorbed by the surfaces prior to reaching the sides of overlay 10. However, due to surface impurities some light is reflected at a shallow angle and migrates by reflection to the sides of overlay 10 where it is received by photodiodes 14. Light which impinges on photodiodes 14 under normal conditions is registered by microprocessor 16 as ambient noise or light for setting a noise threshold in order to calibrate each dome 12.

Microprocessor 16, which can be, typically, Intel microprocessor 8748, with internal RAM (not shown), can be programmed in a well known manner to sequentially pulse each LED 13 via bus 15 for coordinating light received by photodiodes 14 and a point or area of pressure applied to overlay 10. Pressure applied to overlay 10 causes domes 12 within the pressure area to deform in proportion to the applied pressure. Thus, the optical coupling between a LED 13 and its respective dome 12 increases proportionately to the degree that a dome 12 collapses.

Amplifier 21, which can be, typically, an operational amplifier, amplifies the light induced currents outputted by photodiodes 14 for digital conversion by analog to digital converter 20. Converter 20 passes a digital representation of the current signals to microprocessor 16 via digital bus 19. Microprocessor 16 compares the digital information against threshold information stored in memory respective to the pulsed LED 13 to discern whether the information resulted from ambient light or pressure applied to overlay 10.

The digital information may be discarded if it fails to exceed the ambient threshold. Signals due to pressure or information which exceeds the ambient threshold is stored in microprocessor 16 memory at a location directly or indirectly indicative of the matrix coordinates of the respective pulsed LED. One arrangement for distinguishing between constant signals and actual signals is shown in U.S. Pat. No. 4,305,071, issued Dec. 8, 1981 to Bell et al.

The output from photodiodes 14 is proportional to the amount of light modulated by overlay 10. Increasing the pressure applied to overlay 10 causes a corresponding increase in the deformation of a dome 12 at the point of pressure and, thus, causes a proportional increase in the optical coupling between the deformed dome 12 and its respective LED 13. An increase in optical coupling between a dome 12 and its respective LED 13 proportionately increases the packet of light entering overlay 10 at a shallow angle where it migrates by reflection to the sides of overlay 10 for reception by photodiodes 14.

Since LEDs 13 are pulsed one at a time by microprocessor 16 the digitized current packet can be correlated by microprocessor 16 to a particular pulsed LED 13. Microprocessor 16 can be easily programmed in a well known manner to translate the packet of digitized photodiode 14 current into a value indicative of the pressure applied to overlay 10. Microprocessor 16 can be further programmed to compare the translated value to a reference pressure value stored in microprocessor 16 memory for controlling the pressure applied to overlay 10 via pressure output 18. Pressure output 18 can be connected in a feedback arrangement to an external device (not shown), such as a means for controlling a robotic claw.

Figure 2:
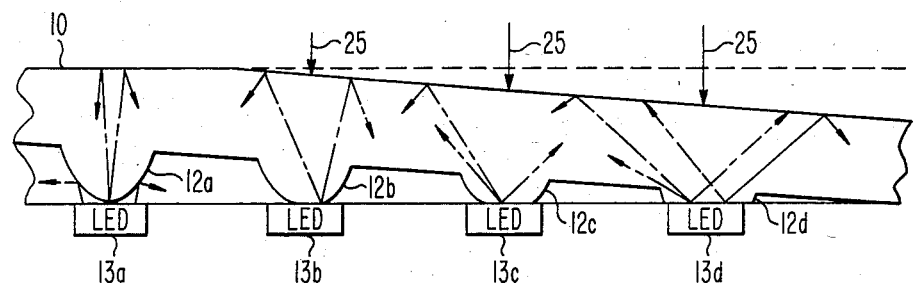
FIG. 2 is a partial cutaway view of my invention showing a pressure gradient applied to the overlay.

Referring to FIG. 2, there is shown a pressure gradient applied to a section of overlay 10 in registration with a respective section of LEDs 13. As shown, the degree to which domes 12 deform or collapse is proportional to the pressure gradient, assuming pressure proportionately increases from left to right and in which the length of arrows 25 is indicative of increasing pressure. A dome 12 outside of the pressure gradient, such as dome 12a, is unaffected by the pressure and retains its shape. Thus, the optical coupling between dome 12a and its respective LED 13a is minimal. Most of the light emitted by LED 13a strikes the sides of companion dome 12a at a shallow angle where it is reflected into the air gap between adjacent domes 12. In contrast, dome 12b which is within the range of the pressure gradient collapses accordingly to increase the optical coupling of light emitted by LED 13b into overlay 10. The light entering overlay 10 through dome 12b enters at an angle sufficiently shallow to permit the entrapped light to migrate by reflection between the surfaces of overlay 10 and reflector 11 to reach the sides of overlay 10 for reception by photodiodes 14 (FIG.1).

Continuing with FIG. 2, dome 12c which is within the vicinity of increasing pressure 25 collapses proportionately with respect to the pressure applied at that point thereby increasing the area of contact with LED 13c and thereby increasing the optical coupling between the devices 12c, 13c. Accordingly, a still larger portion of the light entering overlay 10 via devices 12c, 13c enters at a shallow angle. The light entering overlay 10 at a shallow angle is transported by reflection between the surfaces of overlay 10 and reflector 11 (FIG. 1) to the sides of overlay 10 where it impinges on photodiodes 14. The output from photodiodes 14 responsive to the impinging light is transferred to microprocessor 16 via lead 22, circuits 20, 21 and bus 19 (FIG. 1).

Dome 12d at the center of pressure 25 collapses due to pressure applied at that point on overlay 10 and makes full contact with LED 13d allowing virtually all of the light emitted by pulsed LED 13d to enter overlay 10. Except for a small portion of this light, which enters overlay 10 at an angle nearly perpendicular to dome 12d, most of the pulsed light enters overlay 10 at a shallow angle and is representative of the maximum light that traverses overlay 10 by reflection and impinges upon diodes 14. The digital response that microprocessor 16 receives from the circuit as a result of pulsing LED 13d is recorded and compared to the information received respective to LEDs 13a, 13b and 13c for locating the center of the pressure gradient and for mapping a profile of the pressure gradient.

Figure 3:
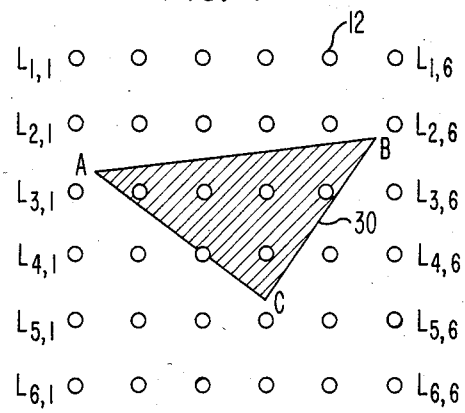
FIG. 3 shows an xy matrix representative of the overlay and respective light emitting diodes with a triangular object exerting pressure on the overlay.

Besides programming for calibration to compensate for individual differences between dome 12, LED 13 pairs and the physical light path to sides of overlay 10, microprocessor 16 can be programmed in a well known manner to include a signal processing program for pattern recognition. For example, it would be most useful if an array of dome 12, LED 13 pairs could be arranged to recognize the length and orientation of the edges of an object pressed against overlay 10. Referring to FIG. 3, there is shown an array of six rows of six LEDs 13 each and in which a triangular object 30 is pressed against overlay 10 (not shown).

Since pressure applied at a point on a compliant overlay causes shear forces to occur, a dome 12 within the vicinity of the pressure point will collapse proportional to its distance from the pressure point and proportional to the physical characteristics of the overlay. For example, referring to FIG. 3, domes at coordinates $L_{2,1}$, $L_{2,2}$ and $L_{3,1}$, $L_{3,2}$ represented by the circles 12 will collapse or deform due to a shear force imposed by the pressure applied at point A. Recognizing this aspect, edge AB of object 30 causes an increase in light emitted by LEDs 13 located at coordinates $L_{2,1}$ through $L_{2,6}$ and $L_{3,1}$ through $L_{3,6}$ to be detected at the sides of overlay 10 by photodiodes 14 (shown in FIG. 2). By comparing the ratios $L_{21}/L_{31}$, $L_{22}/L_{32}$, $L_{23}/L_{33}$, $L_{24}/L_{34}$, $L_{25}/L_{35}$ and $L_{26}/L_{36}$ representative of the light detected by photodiodes 14 from LEDs positioned at coordinates $L_{2,1}$, $L_{2,2}$ and so on the slope and vertical position of edge AB of pressure object 30 can be determined.

In the same manner, edge AC of pressure object 30 can be determined from the ratios $L_{31}/L_{32}$, $L_{32}/L_{42}$, $L_{43}/L_{53}$, $L_{53}/L_{54}$ and $L_{54}/L_{64}$ representative of the light detected by photodiodes 14 from LEDs positioned at coordinates $L_{3,1}$, $L_{3,2}$ and so on. The intersection of edges AB and AC determines point A. Edge BC can be determined in the same manner as discussed above and can be used in conjunction with edges AB and AC to determine points B and C.

Accumulation of the signals emitted from all of the LEDs 13 affected by the pressure can be used to measure the total force applied to the object.

Total Internal Reflection Criteria

Figure 4:
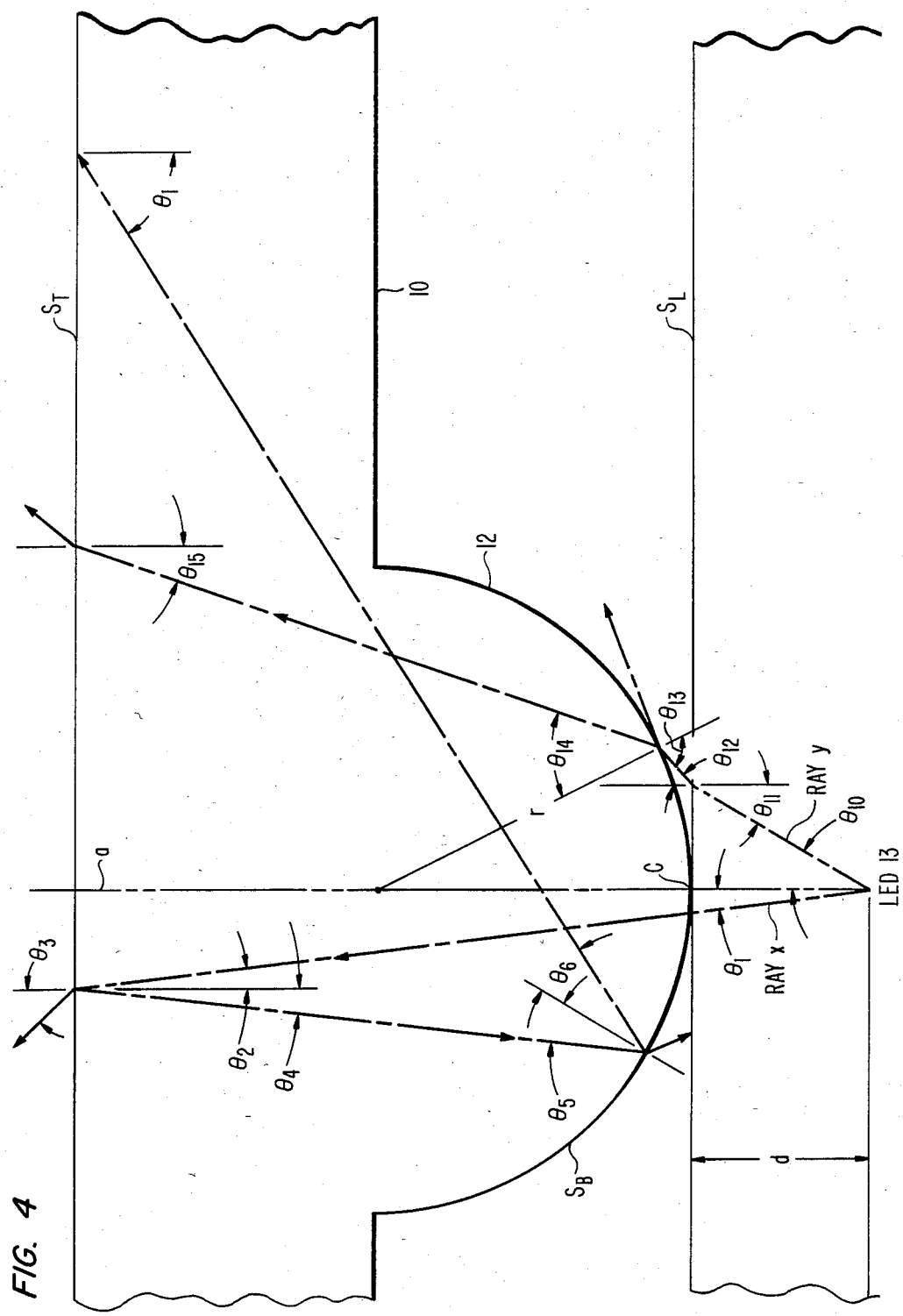
FIGS. 4 and 5 illustrate the principles on which my invention is based.

Referring to FIG. 4, a more explicit relationship between the applied pressure and the signal from the photodetector may be derived by using several simplifying conditions as illustrated. The light source (LED) 13 is assumed to be a point source located a distance below the surface that is contacted by the pressure dome 12. The light from the source is emitted in all upwards directions, but the intensity in any direction is proportional to $\cos \theta$, where $\theta$ is the angle between a light ray and the axis of symmetry a. The material around LED 13, such as a clear plastic lens cap or a planar piece of plastic material in which a plurality of LEDs 13 are embedded, and the clear rubber overlay material 10 have a similar index of refraction ($N_{RUB}$) of about 1.45. Pressure dome 12 is assumed to be hemispherical with radius r.

When no pressure is applied, pressure dome 12 contacts LED 13 surface material with a diminishingly small circular area of radius c. A light ray, such as light ray x, can pass from the LED material into the rubber overlay 10 with little loss if the angle $\theta_1$ from the symmetry axis a is less than $\tan^{-1}(c/d)$. Since there is no air between the rubber and the LED material in this area and since the index refraction is nearly identical, the only loss is due to surface imperfections. The light that enters the rubber through this path meets the top surface $S_T$ of overlay 10 at a steep angle $\theta_2 = \theta_1$, and most of the light leaves with angle $\theta_3 > \theta_2$ if the surface is exposed to air. Some light will be reflected at surface $S_T$ with angle $\theta_4 = \theta_2 = \theta_1$ and reach the bottom surface $S_B$ of overlay 10 at an angle $\theta_5$ measured relative to the surface normal (a radius of the hemispherical pressure dome). Much of this light will escape, but some will reflect with angle $\theta_6 = \theta_5$. This reflected ray will strike the surface $S_T$ of overlay 10 with angle $\theta_7$. If this angle is greater than the total internal reflection angle $= \sin^{-1} |N_{AIR}/N_{RUB}|$ where $N_{AIR}$ is the index of refraction of air ($=1$) and $N_{RUB}$ is the index of refraction of the clear rubber ($\approx 1.45$), the light ray is trapped, and may eventually reach the photodetector. However, since there are at least two reflections between surfaces $S_T$ and $S_B$ with large losses before the ray is trapped, the coupling is very poor.

Now consider light ray y illustrated in FIG. 4 with an angle $\theta_{10}$ to the symmetry axis a. Light ray y meets LED surface $S_L$ with angle $\theta_{11}$, and enters the air with angle $\theta_{12} = \sin^{-1} |(N_{SL} \sin \theta_{11})/N_{AIR}|$. Since the index of refraction of surface SL is greater than the index of refraction of air, $N_{SL} < N_{AIR}$, the ray is bent away from the normal. The ray meets the pressure dome at a very shallow angle so that most of the light is reflected. Some light does enter the rubber with angle $\theta_{14}$, and eventually meets surface $S_T$ at angle $\theta_{15}$. However, this angle cannot satisfy the total internal reflection condition since $\theta_{15}$ must be less than $\theta_{11}$ because the surface $S_B$ of overlay 10 is inclined relative to surface $S_L$. Thus, for $\theta_{15}$ to satisfy the total internal reflection condition, $\theta_{11}$ must be greater than angle $\theta_{15}$, and the light could not leave the LED surface material.

For the conditions described, there is no low loss path that will allow the light from the LED to pass into the rubber and be trapped by the total internal reflection condition. Any light that does enter the overlay is considered background light by the microprocessor program.

Figure 5:
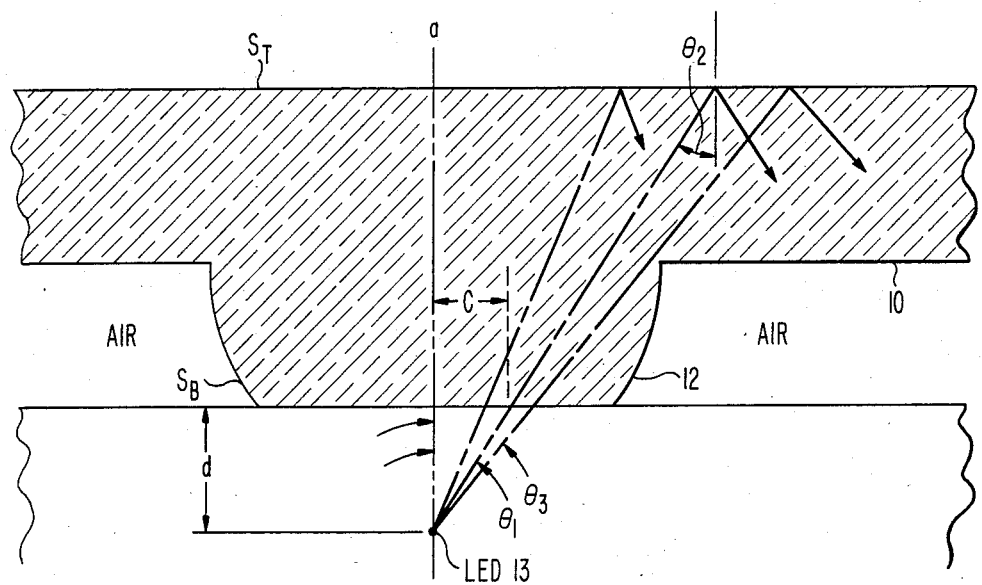

FIG. 5 shows the condition in which pressure dome 12 is deformed, and the contact area between overlay 10 and LED 13 is larger. The contact area can grow large enough so that the condition for total internal reflection is satisfied directly by $$\sin^{-1} |N_{AIR}/N_{RUB}| = \tan^{-1} |c/d| = \theta_1.$$

Thus, all the light emitted with angles between $\theta_1$ and $\theta_3$ will be trapped by total internal reflections between overlay 10 surface $S_T$ and $S_B$, and may eventually reach the photodetectors placed at the side edges of overlay 10.

Figure 6:
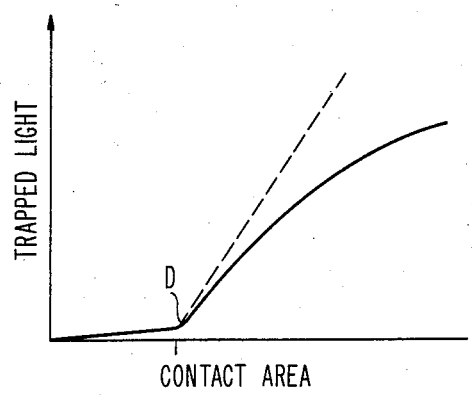
FIG. 6 shows a graph illustrating the amount of light which is trapped within the overlay as a function of a dome/LED contact area.

Referring to FIG. 6, there is shown the amount of trapped light (by total internal reflection) as a function of the contact area between the pressure dome and LED material. As illustrated in FIG. 6, there is a discontinuity D in the response when the contact radius allows total internal reflection. The trapped light would grow linearly with the contact area (as shown by the dashed line) if it were not for the $\cos(\theta)$ function of the emitted light (solid line). Thus, there is less light to trap at the larger contact radius c, and the amount of trapped light is less than linear.

The response shape illustrated in FIG. 6 can be controlled by adjusting the shape of the pressure dome. For example, if the dome is truncated so that zero pressure causes the contact area to just satisfy the total internal reflection condition, then the discontinuity D shown in FIG. 6 can be eliminated. Additionally, the dome shape establishes the relation between pressure and contact area. Nonlinearities in the response can be added or compensated by changing the dome shape.

It should be noted that only the most dominate effect has been considered here, and there are other effects that can contribute significant amounts of trapped light and cause the trapped light to scatter before it reaches the photodetectors.

Conclusion

It is understood that my invention is not only applicable to optical signals but is also applicable to other signals which obey the same physical phenomenon described herein, such as electronic and acoustical signals. It is, of course, to be further understood that the tactile domes described herein can vary widely in shape and material without departing from the scope of my invention. For example, the domes could be parabolic, circular as well as elliptical in shape; or the overlay could be manufactured from different materials each having a different compliancy to fit particular applications. It should be still further understood that my invention is also applicable to fields other than robotics, such as the emerging field of touch sensitive screens and the field of security devices in which the overlay described herein could be arranged as a part of a floor covering to either detect the presence of an intruder or to detect the weight and positioning of objects.

Further, it is obvious to those skilled in the art that the placement of light emitting diodes and light detectors disclosed herein may be intercharged without departing from the scope and spirit of the invention claimed herein.

What is claimed is:

1. A touch-sensitive device adapted for use in conjunction with a source of signals, comprising
    an overlay having at least one protrusion, said at least one protrusion being so disposed with respect to said source of signals and so adapted that contact between said at least one protrusion and said source of signals is increased when pressure is applied to said overlay and that signals from said source of signals that become trapped in said overlay by total internal reflection increase as a result of said increased contact, and
    means for providing detection signals indicative of the level of said trapped signals.

2. The invention set forth in claim 1 further comprising a reflective surface in contact with an exterior surface of said overlay, whereby at least ones of said trapped signals are prevented from passing through said exterior surface.

3. The invention set forth in claim 1 wherein said means for providing detection signals comprises a signal detector placed along at least one edge of said overlay.

4. The invention set forth in claim 1 wherein said touch-sensitive device further includes processing means for determining the shape of said applied pressure as a function of individual ones of said detection signals.

5. A tactile device comprising
    a source of signals,
    a compliant overlay having at least one deformable protrusion, said at least one deformable protrusion being so disposed with respect to said source of signals that contact between said at least one deformable protrusion and said source of signals is increased when pressure is applied to said overlay and that signals from said source of signals that become trapped in said overlay by total internal reflection increase as a result of said increased contact, and
    means for providing detection signals which are a function of the level of said trapped signals.

6. The invention set forth in claim 5 wherein said tactile device further includes signal processing means for determining the shape of said applied pressure when it is applied to said overlay as a function of the respective levels of individual ones of said detection signals.

7. The invention set forth in claim 6 wherein said signal processing means includes means for determining the level of said applied pressure as a function of the level of said detection signals.

8. A tactile device, comprising
    a source of signals,
    a compliant overlay having at least one protrusion, said at least one protrusion being so disposed with respect to said source of signals and so adapted that contact between said at least one protrusion and said source of signals is increased when pressure is applied to said overlay and that signals from said source of signals that become trapped in said overlay by total internal reflection increase as a result of said increased contact,
    means for providing detection signals indicative of the level of said trapped signals, and
    means for determining the level of said applied pressure as a function of the level of said detection signals.

9. A sensor responsive to pressure, comprising
    a plurality of signal sources,
    compliant material having a plurality of protrusions, individual ones of said protrusions being so disposed with respect to individual ones of said signal sources and so adapted that contact between said individual ones of said protrusions and said individual ones of said signal sources is increased when pressure is applied to said compliant material and that signals from said individual ones of said signal sources that become trapped in said overlay by total internal reflection increase as a result of said increased contact, and
    means for providing detection signals indicative of the level of said trapped signals from said individual ones of said signal sources.

10. The invention set forth in claim 9 wherein said sensor further includes signal processing means for determining the shape of the pattern of said applied pressure when it is applied to said compliant material as a function of the level of individual ones of said detection signals.

11. A tactile device comprising,
    an array of individual sources of signals,
    an overlay having a plurality of protrusions, individual ones of said protrusions being in registration with respective individual ones of said sources of signals, said protrusions being adapted to collapse when pressure is applied to said overlay such that contact between individual ones of said protrusions and respective ones of said source of signals is increased, whereby there is an increase in the level of signals from said respective ones of said sources of signals that become trapped in said overlay by total internal reflection, and
    means for detecting said trapped signals and for providing detection signals which are a function of the level of said trapped signals.

* * * * *